United States Patent
Ning et al.

(10) Patent No.: US 9,544,995 B2
(45) Date of Patent: Jan. 10, 2017

(54) FLEXIBLE SUBSTRATE ATTACHING METHOD AND FLEXIBLE SUBSTRATE ATTACHMENT STRUCTURE

(71) Applicant: BOE TECHNOLOGY GROUP CO., LTD., Beijing (CN)

(72) Inventors: Ce Ning, Beijing (CN); Tao Gao, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 37 days.

(21) Appl. No.: 14/761,986

(22) PCT Filed: Feb. 10, 2015

(86) PCT No.: PCT/CN2015/072622
§ 371 (c)(1),
(2) Date: Jul. 20, 2015

(87) PCT Pub. No.: WO2016/065772
PCT Pub. Date: May 6, 2016

(65) Prior Publication Data
US 2016/0338189 A1    Nov. 17, 2016

(30) Foreign Application Priority Data
Oct. 27, 2014   (CN) .......................... 2014 1 0585036

(51) Int. Cl.
*H05K 1/02*    (2006.01)
*H05K 1/03*    (2006.01)
(Continued)

(52) U.S. Cl.
CPC ............ *H05K 1/028* (2013.01); *H05K 1/0306* (2013.01); *H05K 3/007* (2013.01); *H05K 3/06* (2013.01);
(Continued)

(58) Field of Classification Search
CPC .............. H05K 1/02; H05K 1/03; H05K 3/06; H05K 3/00; H05K 3/46
(Continued)

(56) References Cited

U.S. PATENT DOCUMENTS

2014/0125578 A1*  5/2014  Zhou ........................ G09G 3/20
                                                            345/156
2015/0129122 A1*  5/2015  Kim ....................... H01L 51/003
                                                            156/249

FOREIGN PATENT DOCUMENTS

CN       1505916       6/2004
CN       1838859       9/2006
(Continued)

OTHER PUBLICATIONS

Office action from Chinese Application No. 201410585036.0 dated Aug. 2, 2016.
(Continued)

*Primary Examiner* — Timothy Thompson
*Assistant Examiner* — Charles Pizzuto
(74) *Attorney, Agent, or Firm* — Calfee, Halter & Griswold LLP

(57) ABSTRACT

The present disclosure relates to the technical field of flexible substrate processing, and discloses a flexible substrate attaching method. The flexible substrate attaching method comprises the steps of: pre-fixing a flexible substrate on a carrier substrate with a first fixation structure; forming a thin film on the flexible substrate, and forming a pattern of the thin film via a patterning process; the pattern of the thin film contacting at least a part of the flexible substrate and at least a part of the carrier substrate simultaneously to play the function of consolidating the flexible substrate onto the carrier substrate. In this flexible substrate attaching method, a flexible substrate can be fixed on a carrier substrate and the flexible panel can be detached after the manufacture is (Continued)

completed. The present disclosure further provides a flexible substrate attachment structure.

14 Claims, 2 Drawing Sheets

(51) Int. Cl.
  *H05K 3/06*    (2006.01)
  *H05K 3/00*    (2006.01)
  *H05K 3/46*    (2006.01)

(52) U.S. Cl.
  CPC ......... *H05K 3/467* (2013.01); *H05K 2203/016* (2013.01)

(58) Field of Classification Search
  USPC .......................................................... 174/254
  See application file for complete search history.

(56) References Cited

FOREIGN PATENT DOCUMENTS

| | | |
|---|---|---|
| CN | 1883061 | 12/2006 |
| CN | 101118843 | 2/2008 |
| CN | 102651331 | 8/2012 |
| CN | 103426904 | 12/2013 |
| CN | 104319240 | 1/2015 |

OTHER PUBLICATIONS

International Search Report and Written Opinion from PCT/CN2015/072622 dated May 29, 2015 with Translation.

\* cited by examiner

FLEXIBLE SUBSTRATE ATTACHING METHOD AND FLEXIBLE SUBSTRATE ATTACHMENT STRUCTURE

RELATED APPLICATIONS

The present application is the U.S. national phase entry of PCT/CN2015/072622, with an international filing date of Feb. 10, 2015, which claims the benefit of Chinese Patent Application No. 201410585036.0, filed on Oct. 27, 2014, the entire disclosures of which are incorporated herein by reference.

FIELD

The present disclosure relates to the technical field of flexible substrate processing and, in particular, to a flexible substrate attaching method and a flexible substrate attachment structure.

BACKGROUND

The 21st century is the time of flat panel display in the display field, and among it, flexible display has gained fast growth as the next-generation focus of display technologies. Flexible display is made of a flexible material, which can be deformed, bended, and has the advantages of being slim and light, convenient to carry, etc.

However, a flexible substrate is difficult to process and is thus largely limited in application and development. A general solution to that is to fix a flexible substrate on a rigid carrier substrate before the processing of the flexible substrate. This can realize manufacturing the flexible display using existing devices. However, the prior art flexible substrate attaching processes are relatively complicated and such flexible substrate as manufactured is difficult to get detached after it is completed.

In addition, flexible substrate attaching techniques are generally divided into mechanical attaching and spin coating attaching. The former is easy and convenient for detachment, but more difficult for fixation on the carrier substrate; the latter is not easy for detachment of the completed flexible substrate from the carrier substrate. Therefore, there is a need for providing a relatively simple and readily achievable flexible substrate attaching method in the field.

SUMMARY

In a first aspect of the present disclosure, a flexible substrate attaching method is provided, by which method a flexible substrate can be fixed on a carrier substrate in good effect and the flexible panel can be easily detached after the manufacture is completed.

In order to achieve the object, an embodiment of the present disclosure provides a flexible substrate attaching method, which method may comprise the steps of: pre-fixing a flexible substrate on a carrier substrate with a first fixation structure; forming a thin film on the flexible substrate, and forming a pattern of the thin film via a patterning process; the pattern of the thin film contacting at least a part of the flexible substrate and at least a part of the carrier substrate simultaneously to play the function of consolidating the flexible substrate onto the carrier substrate.

In the above flexible substrate attaching method, the thin film can cause the flexible substrate to be fixed on the carrier substrate, and meanwhile, a flexible panel can be obtained by cutting the flexible substrate through the pattern of the thin film. Since the flexible substrate is directly placed on the carrier substrate and not attached with the carrier substrate, the flexible panel resulted from the cutting can be detached directly.

Therefore, by using the above flexible substrate attaching method, a flexible substrate can be fixed on a carrier substrate in good effect and the flexible panel can be easily detached after the manufacture is completed.

According to an embodiment of the present disclosure, the pattern of the thin film specifically comprises: a plurality of interlaced horizontal and longitudinal strip-like structures separating the flexible substrate into a plurality of regions, each of the regions corresponding to a flexible panel.

According to another embodiment of the present disclosure, the thin film may be a metal thin film.

According to a further embodiment of the present disclosure, the metal thin film may be formed using a magnetron sputtering process.

According to a yet further embodiment of the present disclosure, the patterning process comprises an etching method, which can be a wet-etching.

According to an embodiment of the present disclosure, the pattern of the thin film may comprise a gate line structure or a data line structure.

According to another embodiment of the present disclosure, the first fixation structure may be an adhesive tape.

According to a further embodiment of the present disclosure, the thin film may have a thickness of 300-800 nm.

According to a yet further embodiment of the present disclosure, the flexible substrate may be a thin glass or resin material substrate.

According to an embodiment of the present disclosure, the carrier substrate may be a glass substrate.

In a second aspect of the present disclosure, a flexible substrate attachment structure is provided, comprising: a carrier substrate; a flexible substrate pre-fixed on the carrier substrate via a first fixation structure; and a pattern of a thin film on the flexible substrate, the pattern of the thin film contacting at least a part of the flexible substrate and at least a part of the carrier substrate simultaneously.

According to an embodiment of the present disclosure, the pattern of the thin film can comprise: a plurality of interlaced horizontal and longitudinal strip-like structures separating the flexible substrate into a plurality of regions, each of the regions corresponding to a flexible panel.

According to another embodiment of the present disclosure, the thin film may be a metal thin film.

According to a further embodiment of the present disclosure, the pattern of the thin film may comprise a gate line structure or a data line structure.

BRIEF DESCRIPTION OF THE DRAWINGS

Other objectives and features of the present disclosure will become apparent from the following detailed description considered in conjunction with the accompanying drawings. However, it should be understood that each of the drawings is shown for an illustrative rather than restrictive purpose, and they are not necessarily drawn to scale. In the drawings.

Therein, the same components are denoted with the same reference signs throughout the drawings.

DETAILED DESCRIPTION

In the following the technical solutions in embodiments of the present disclosure will be described clearly and thoroughly in conjunction with the drawings in the embodiments of the present disclosure. It is evident that the described embodiments are only a part of rather than all embodiments of the present disclosure. Based on the embodiments of the present disclosure, all the other embodiments an ordinarily skilled in the art can obtain without making an inventive effort belong to the scope of the present disclosure.

Figure 1:
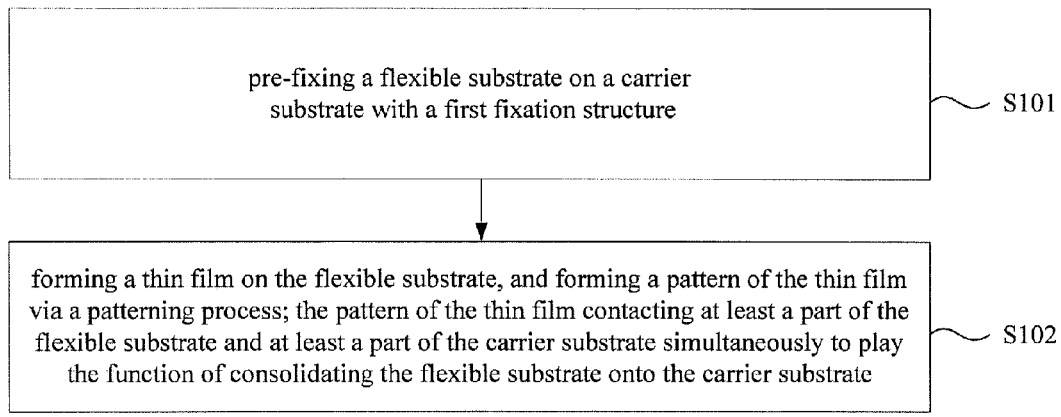
FIG. 1 is a flow chart of a flexible substrate attaching method provided by an embodiment of the present disclosure.
Figure 2:
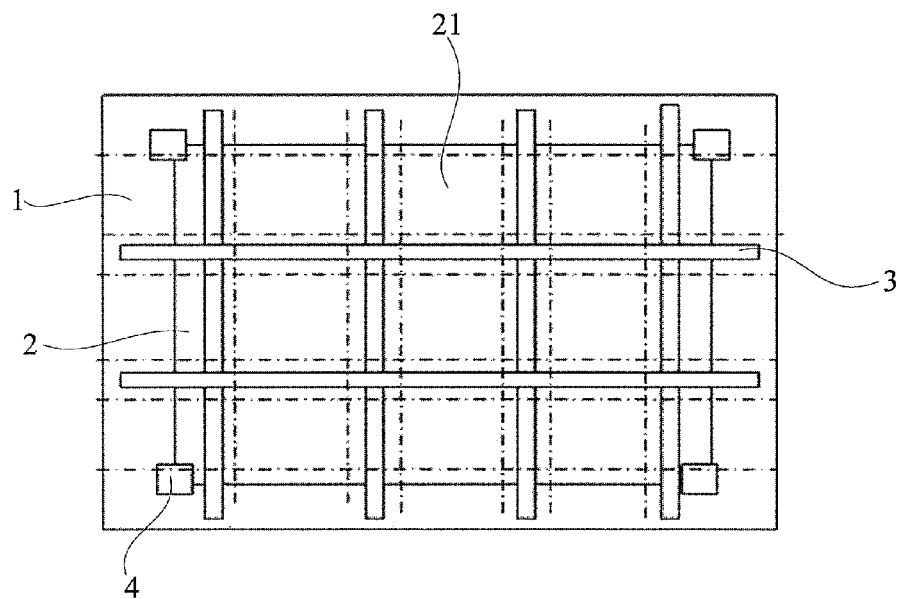
FIG. 2 is a schematic diagram of a flexible substrate attachment structure provided by an embodiment of the present disclosure.
Figure 3:
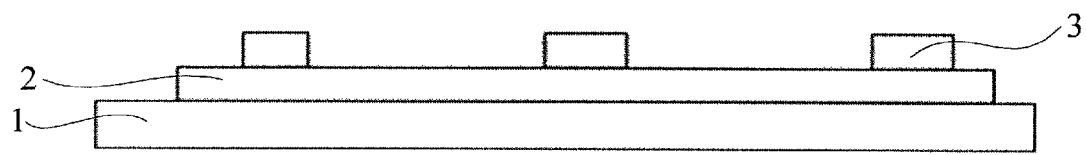
FIG. 3 is a cross sectional schematic diagram of a flexible substrate attachment structure provided by an embodiment of the present disclosure.

Reference is now made to FIG. 1, FIG. 2 and FIG. 3. As shown in FIG. 1, a flexible substrate attaching method as provided comprises the following steps: at step S101, pre-fixing a flexible substrate 2 on a carrier substrate 1 with a first fixation structure 4; at step S102, forming a thin film on the flexible substrate 2, and forming a pattern of the thin film via a patterning process; the pattern of the thin film contacting at least a part of the flexible substrate 2 and at least a part of the carrier substrate 1 simultaneously to play the function of consolidating the flexible substrate 2 onto the carrier substrate 1.

In the above flexible substrate attaching method, in step S102, the thin film formed on the flexible substrate 2 enables the flexible substrate 2 to be fixed on the carrier substrate 1, and meanwhile, a flexible panel can be obtained by cutting the flexible substrate 2 through the pattern of the thin film. Since the flexible substrate 2 is directly placed on the carrier substrate 1 and not attached with the carrier substrate 1, the flexible panel resulted from the cutting can be detached from the carrier substrate 1 directly.

Therefore, by using the above flexible substrate attaching method, the flexible substrate 2 can be fixed on the carrier substrate 1 in good effect and the flexible panel can be easily detached after the manufacture is completed.

As shown in FIG. 2, the pattern of the thin film specifically comprises: a plurality of interlaced horizontal and longitudinal strip-like structures 3 separating the flexible substrate 2 into a plurality of regions 21, each of the regions 21 corresponding to a flexible panel.

In the pattern of the thin film, by attaching both ends of the plurality of horizontal and longitudinal strip-like structures 3 to the edges of the carrier substrate 1, the flexible substrate 2 can be fixed to the carrier substrate 1, and meanwhile, the flexible substrate 2 is cut along an edge of the regions 21 as separated by the strip-like structures 3, i.e. along the dashed lines as shown in FIG. 2, by which a part in the flexible substrate 2 corresponding to each region 21 can be cut into a flexible panel.

In addition, the thin film is a metal thin film.

In particular, in step S102, the metal thin film is formed using a magnetron sputtering process.

In addition, in step S102, the patterning process comprises an etching method, which can be a wet-etching.

In particular, the pattern of the thin film as formed in step S102 may further comprise a gate line structure or a data line structure.

In particular, the thin film has a thickness of 300-800 nm.

In particular, in step S101, the first fixation structure 4 can be an adhesive tape, whereby four corners of the flexible substrate 2 can be pre-fixed on the carrier substrate 1 by using the adhesive tape.

In particular, the flexible substrate 2 is a thin glass or resin material substrate; the carrier substrate 1 is a glass substrate.

It is evident that those skilled in the art can make various modifications and variations to the embodiments of the present disclosure without departing from the spirit and the scope of the present invention. In this case, if these modifications and variations belong to the scope of the appended claims and their equivalent technologies, the present disclosure is intended to cover these modifications and variations.

The invention claimed is:

1. A flexible substrate attaching method comprising the steps of:
pre-fixing a flexible substrate on a carrier substrate with a first fixation structure;
forming a thin film on the flexible substrate, and forming a pattern of the thin film via a patterning process; the pattern of the thin film contacting at least a part of the flexible substrate and at least a part of the carrier substrate simultaneously to play the function of consolidating the flexible substrate onto the carrier substrate.

2. The flexible substrate attaching method according to claim 1, wherein the pattern of the thin film comprises: a plurality of interlaced horizontal and longitudinal strip-like structures separating the flexible substrate into a plurality of regions, each of the regions corresponding to a flexible panel.

3. The flexible substrate attaching method according to claim 1, wherein the thin film is a metal thin film.

4. The flexible substrate attaching method according to claim 3, wherein the metal thin film is formed using a magnetron sputtering process.

5. The flexible substrate attaching method according to claim 3, wherein the patterning process comprises an etching method, which is a wet-etching.

6. The flexible substrate attaching method according to claim 2, wherein the pattern of the thin film further comprises a gate line structure or a data line structure.

7. The flexible substrate attaching method according to claim 1, wherein the first fixation structure is an adhesive tape.

8. The flexible substrate attaching method according to claim 1, wherein the thin film has a thickness of 300-800 nm.

9. The flexible substrate attaching method according to claim 1, wherein the flexible substrate is a thin glass or resin material substrate.

10. The flexible substrate attaching method according to claim 1, wherein the carrier substrate is a glass substrate.

11. A flexible substrate attachment structure, comprising:
a carrier substrate;
a flexible substrate pre-fixed on the carrier substrate via a first fixation structure; and
a pattern of a thin film on the flexible substrate, the pattern of the thin film contacting at least a part of the flexible substrate and at least a part of the carrier substrate simultaneously.

12. The flexible substrate attachment structure according to claim 11, wherein the pattern of the thin film comprises: a plurality of interlaced horizontal and longitudinal strip-like structures separating the flexible substrate into a plurality of regions, each of the regions corresponding to a flexible panel.

13. The flexible substrate attachment structure according to claim 11, wherein the thin film is a metal thin film.

14. The flexible substrate attachment structure according to claim 12, wherein the pattern of the thin film further comprises a gate line structure or a data line structure.

* * * * *